(12) United States Patent
Libby et al.

(10) Patent No.: US 9,026,424 B1
(45) Date of Patent: May 5, 2015

(54) EMULATION OF MULTIPLE INSTRUCTION SETS

(75) Inventors: Jeffrey G. Libby, Cupertino, CA (US); Jean-Marc Frailong, Los Altos, CA (US); Sharada Yeluri, San Jose, CA (US); Jianhui Huang, Fremont, CA (US); John Keen, Mountain View, CA (US); Rajesh Nair, Fremont, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 1448 days.

(21) Appl. No.: 12/258,487

(22) Filed: Oct. 27, 2008

(51) Int. Cl.
*G06F 9/455* (2006.01)
*G06F 12/00* (2006.01)
*G06F 17/50* (2006.01)

(52) U.S. Cl.
CPC ............ *G06F 9/455* (2013.01); *G06F 9/45504* (2013.01); *G06F 12/00* (2013.01); *G06F 17/50* (2013.01)

(58) Field of Classification Search
CPC ..... G06F 9/455; G06F 9/45504; G06F 12/00; G06F 17/50
USPC ...................................................... 703/26, 27
See application file for complete search history.

(56) References Cited

U.S. PATENT DOCUMENTS

| 4,415,969 | A | * | 11/1983 | Bayliss et al. | 712/227 |
| 5,430,862 | A | * | 7/1995 | Smith et al. | 703/26 |
| 5,537,560 | A | * | 7/1996 | Boggs et al. | 712/245 |
| 5,619,665 | A | * | 4/1997 | Emma | 712/208 |
| 5,848,268 | A | * | 12/1998 | Matsuo | 712/233 |
| 5,968,167 | A | * | 10/1999 | Whittaker et al. | 712/225 |
| 6,397,324 | B1 | * | 5/2002 | Barry et al. | 712/225 |
| 7,047,394 | B1 | * | 5/2006 | Van Dyke et al. | 712/209 |
| 8,055,877 | B1 | * | 11/2011 | Kelly et al. | 711/206 |
| 8,136,158 | B1 | * | 3/2012 | Sehr et al. | 726/22 |
| 2008/0140971 | A1 | * | 6/2008 | Dankel et al. | 711/163 |
| 2009/0204785 | A1 | * | 8/2009 | Yates et al. | 711/205 |
| 2010/0299506 | A1 | * | 11/2010 | Greiner et al. | 712/223 |
| 2012/0042145 | A1 | * | 2/2012 | Sehr et al. | 711/163 |

* cited by examiner

*Primary Examiner* — Omar Fernandez Rivas
*Assistant Examiner* — Angel Calle
(74) *Attorney, Agent, or Firm* — Harrity & Harrity, LLP (57) ABSTRACT

A device may emulate target instructions by executing a first set of microinstructions, and may store a base address of a table that includes a microinstruction provided in a second set of microinstructions for emulating the target instructions. The device may also locate the microinstruction based on the stored base address, and emulate one of the target instructions by executing the microinstruction.

20 Claims, 7 Drawing Sheets

EMULATION OF MULTIPLE INSTRUCTION SETS

BACKGROUND

Devices, such as switches or routers, may be used not only to route and/or switch packets to their destinations at different network layers, but also to collect information related to network clients, applications hosted on network devices, and/or network traffic.

SUMMARY

According to one aspect, a method may include emulating target instructions by executing a first set of microinstructions, storing a base address of a table that includes a microinstruction provided in a second set of microinstructions for emulating the target instructions, locating the microinstruction based on the stored base address, and emulating one of the target instructions by executing the microinstruction.

According to another aspect, a device may include a first memory for storing target instructions. The device may also include a processor. The processor may include a second memory for storing a first set of microinstructions and a second set of microinstructions. In addition, the processor may include registers for loading the target instructions from the first memory. The processor may be configured to emulate the target instructions by executing the first set of microinstructions. In addition, the processor may be further configured to store, in the registers, a base address of a table that includes a microinstruction provided in the second set of microinstructions. Further, the processor may be configured to retrieve the base address of the table from the registers, use the base address to locate the microinstruction, and emulate one of the target instructions by executing the microinstruction.

According to yet another aspect, a device may include means for storing a target instruction, means for storing a plurality of sets of microinstructions, means for emulating the target instruction by executing one of the plurality of sets of microinstructions, means for storing a base address of a table that includes a microinstruction of another of the plurality of sets of microinstructions, means for using the stored base address to access a microinstruction in the other of the plurality of sets of microinstructions, and means for emulating the target instruction by accessing the microinstruction in the other of the plurality of sets of microinstructions and executing the accessed microinstruction.

BRIEF DESCRIPTION OF THE DRAWINGS

The accompanying drawings, which are incorporated in and constitute a part of this specification, illustrate one or more embodiments described herein and, together with the description, explain the embodiments. In the drawings.

DETAILED DESCRIPTION OF PREFERRED EMBODIMENTS

The following detailed description refers to the accompanying drawings. The same reference numbers in different drawings may identify the same or similar elements. The term "packet," as used herein, may include a packet, a datagram, and/or a cell; a fragment of a packet, a datagram, and/or a cell; and/or other types of data.

The term "emulation of an instruction set," as used herein, may include execution of microcode to imitate or mimic execution of an instruction set. For example, a device may perform various tasks (e.g., firewall rule search, tree search, packet parsing control, etc.) by emulating different instruction sets. Further, microinstructions may emulate a target instruction, if execution of the microinstructions emulates execution of the target instruction.

As used herein, the term "microinstruction" may include a microcode instruction. The term "target instruction," as used herein, may refer to an instruction that is being emulated.

Figure 1:
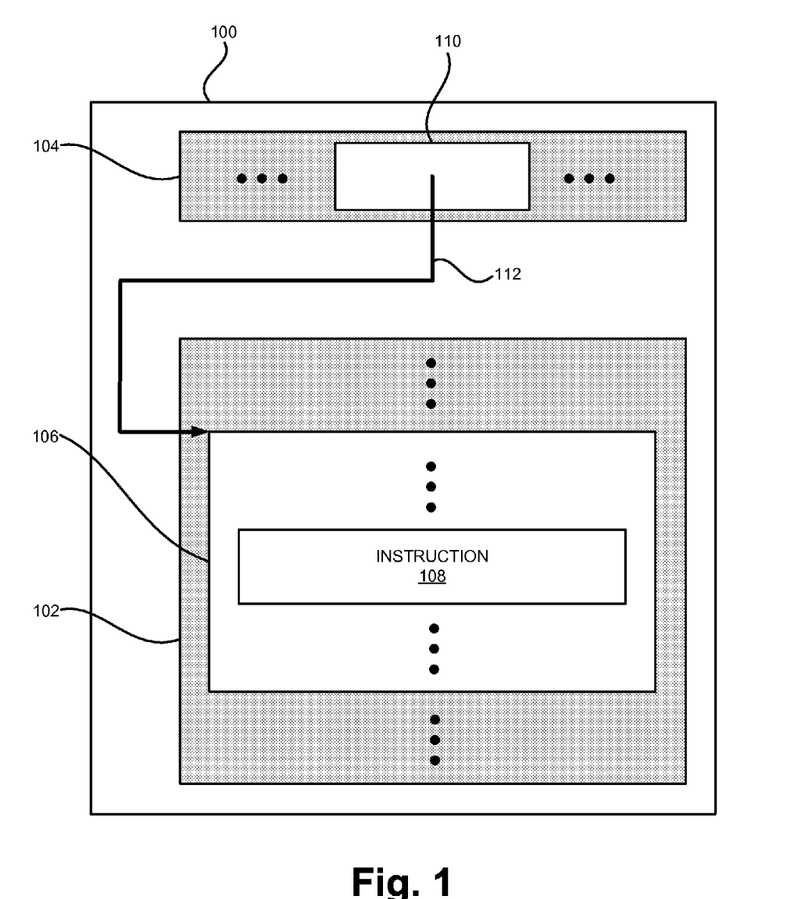
FIG. 1 is a block diagram illustrating exemplary concepts described herein.

As described below, a device may provide efficient emulation of multiple instruction sets (e.g., sets of target instructions). FIG. 1 is a block diagram that illustrates concepts described herein. As shown, a device 100 may include a memory 102 and a register 104. Although FIG. 1 shows exemplary components of device 100, in other implementations, device 100 may include fewer, different, or additional components than depicted in FIG. 1.

Memory 102 may include a memory device that may store multiple microinstruction tables, such as a microinstruction table 106 (e.g., a trap vector). The term "memory device," as used herein, may refer to dynamic memory, such as registers, on-chip memory (e.g., on-board cache), random access memory (RAM), static RAM (SRAM), for storing data and machine-readable instructions. Depending on context, "memory device" may also refer to static memory, such as read only memory (ROM), or storage devices, such as a floppy disk, Compact Disk (CD) ROM, CD read/write (R/W) disc, and/or flash memory, as well as other types of storage devices.

Microinstruction table 106 may include microinstructions, such as an instruction 108. Each of the microinstructions (e.g., instruction 108) may be the first microinstruction of one or several microinstructions that emulate a target instruction (not shown). Register 104 may include a base address 110 of microinstruction table 106. This is indicated by an arrow 112, which points to the top of microinstruction table 106.

To emulate a target instruction of an instruction set, device 100 may load the target instruction from a memory (e.g., an external memory) (not shown) into registers (e.g., register 104). Subsequently, based on base address 110 and contents of the registers, device 100 may locate and execute microinstructions that may emulate the target instruction.

To emulate a target instruction of another instruction set, device 100 may load a base address of a microinstruction table that corresponds to the other instruction set into register 104, and may load the target instruction into the registers (e.g., register 104). Subsequently, based on the base address and the contents of the registers, device 100 may locate and execute microinstructions that may emulate the target instruction of the other instruction set.

Device 100 may switch from emulating one target instruction set to emulating another target instruction set (e.g., device 100 may emulate multiple instruction sets) by storing the base address of a microinstruction table that corresponds to the other target instruction set in register 104. Such a switch may be efficient since the switch may incur zero or only few additional processing cycles.

Figure 2:
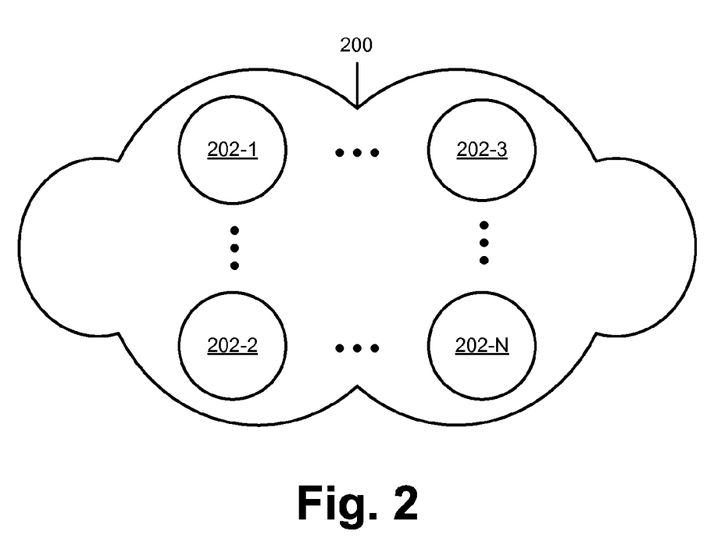
FIG. 2 is a diagram of an exemplary network in which concepts described herein may be implemented.

FIG. 2 illustrates a network 200 in which concepts described herein may be implemented. Network 200 may include the Internet, an intranet, a local area network (LAN), a wide area network (WAN), a metropolitan area network (MAN), a cellular network, a public switched telephone network (PSTN), an ad hoc network, any other network, or a combination of one or more networks.

As shown in FIG. 2, network 200 may include devices 202-1 through 202-N (individually referred to herein as a "device 202-$x$"). Device 202-$x$ may include, for example, device 100, a router, a switch, a gateway, a server, a personal computer, etc. Although device 202-$x$ may be implemented as any computer-like device, in the following description, device 202-$x$ will be described in terms of a router/switch.

Figure 3:
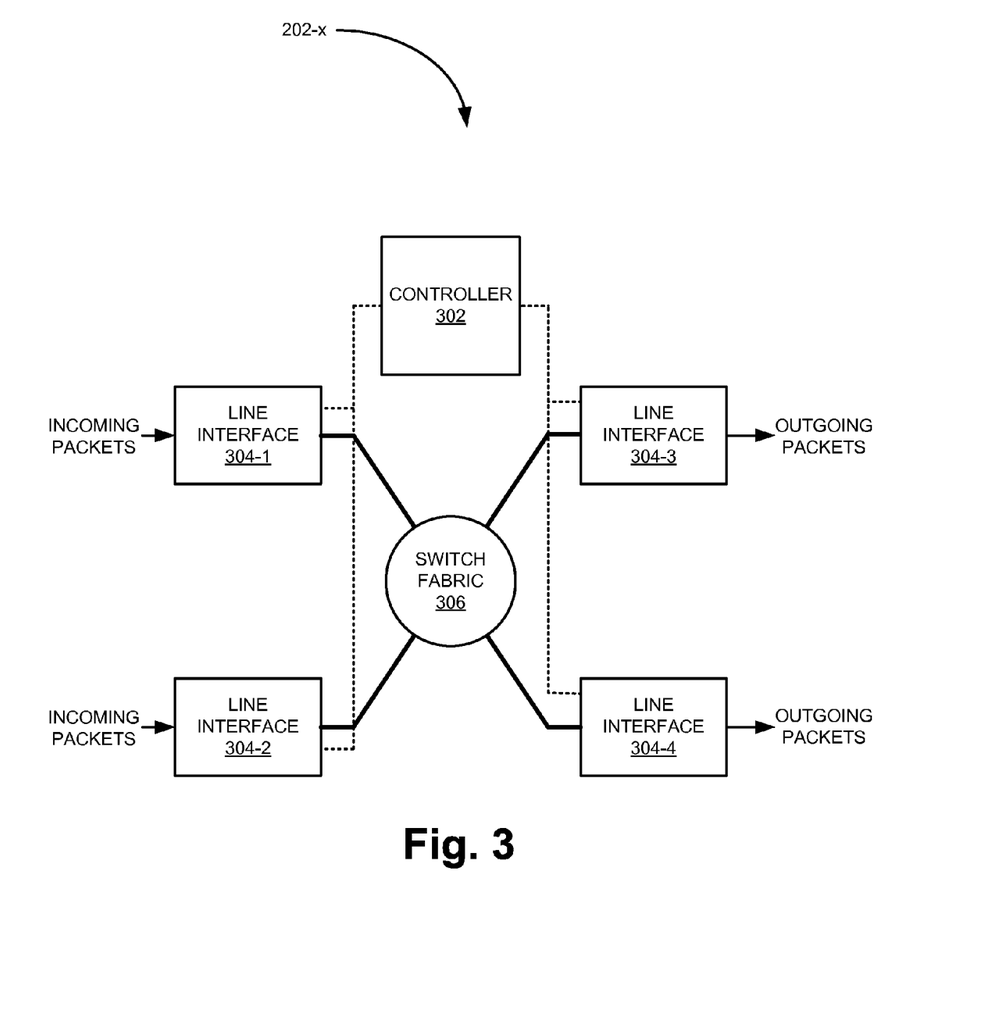
FIG. 3 is a block diagram of an exemplary device of FIG. 2.

FIG. 3 illustrates exemplary components of device 202-$x$. As shown, device 202-$x$ may include a controller 302, line interfaces 304-1 through 304-4 (collectively referred to herein as "line interfaces 304" and individually as "line interface 304-$x$"), and a switch fabric 306

Controller 302 may include one or more components for managing routes and/or types of information that may require centralized processing. For example, controller 302 may manage routes (e.g., may accept or disseminate routes to other devices 202) in accordance with routing/signaling protocols, may receive and process statistics related to packets, and/or may process packet samples from other components of device 202-$x$ (e.g., from line interfaces 304). In another example, controller 302 may provide functionalities related to distributing information (e.g., rules for classifying packets) to other components of device 202-$x$.

Line interface 304-$x$ may include one or more components for receiving packets from devices in network 200 and for transmitting the packets to other devices in network 200. In addition, line interface 304-$x$ may forward packets, classify packets, redirect packets to other components in device 202-$x$, manage a table of packet statistics, and/or sample packets.

Switch fabric 306 may include one or more switches for conveying packets from line interfaces 304 and/or other modules of device 202-$x$ (not shown) to line interfaces 304 and/or to the other modules.

Device 202-$x$ may include fewer, additional, and/or different components than shown in FIG. 3. For example, device 202-$x$ may include additional or fewer line interfaces or additional controllers. Device 202-$x$ may further include one or more modules (not shown) that may connect to switch fabric 306 and may perform various network services. For example, device 202-$x$ may include a firewall service module, an intrusion detection service module, an encryption/decryption service module, and/or other types of service modules.

Figure 4:
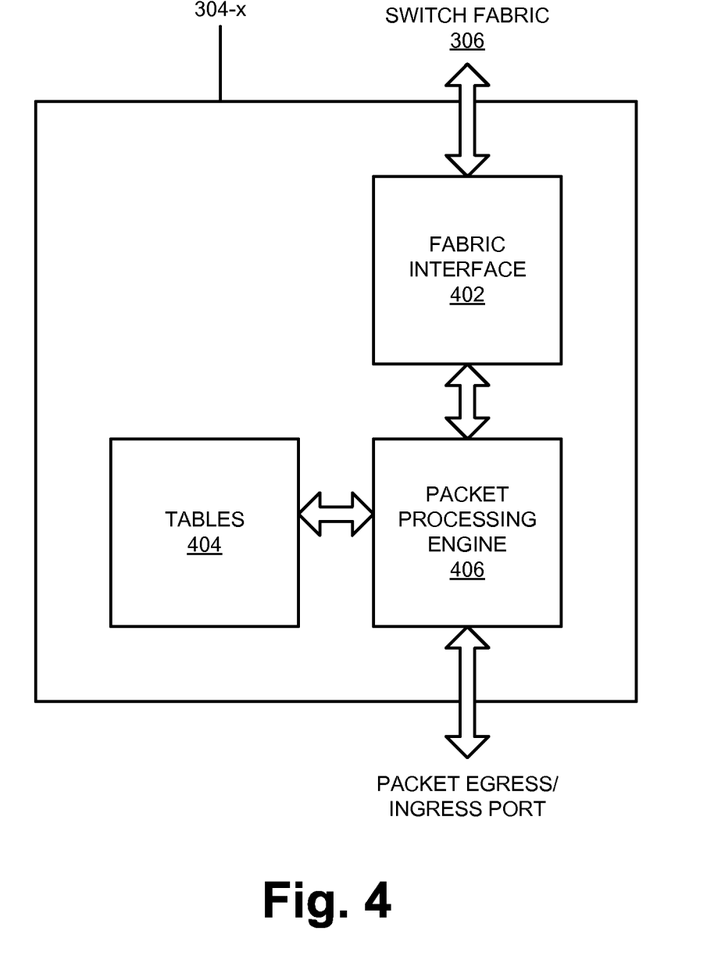
FIG. 4 is a functional block diagram of an exemplary line interface of FIG. 3.

FIG. 4 is a block diagram of exemplary functional components of line interface 304-$x$. As shown, line interface 304-$x$ may include a fabric interface 402, tables 404, and a packet processing engine 406. Depending on implementation, line interface 304-$x$ may include fewer, additional, or different elements than those illustrated in FIG. 4. Although FIG. 4 shows exemplary functional components of line interface 304-$x$, in other implementations, line interface 304-$x$ may include fewer, different, or additional functional components than depicted in FIG. 4. For example, in one implementation, line interface 304-$x$ may include an interface located between packet processing engine 406 and packet egress/ingress port.

Fabric interface 402 may include hardware, software, or a combination of hardware and software that provide an interface to switch fabric 306. For example, fabric interface 402 may include one or more buffers (not shown) for temporarily storing augmented packets (e.g., packets pre-pended with additional header information) received from packet processing engine 406. The buffers may prevent the packets from being dropped if a bottleneck (e.g., a processing delay) develops on a line interface-to-line interface path during packet transport.

Tables 404 may include a classification table, a forwarding table, and/or any other tables that may be used for processing packets. A classification table may include rules for categorizing a packet based on a packet header. Examples of classification rules may include rules for performing an access control list lookup for security purposes, rules for performing policy-based routing (e.g., if a packet header is a telephony packet, the classification rules may route the packet from one location to another location via an asynchronous transfer mode (ATM) circuit), and/or rules for rendering differentiated quality of service (QoS). A forwarding table may include information for identifying an egress line interface to forward an incoming packet to a network node based on the packet's network destination address.

Packet processing engine 406 may include hardware, software, or a combination of hardware and software that forwards and/or classifies a packet received at line interface 304-$x$. Packet processing engine 406 may perform a lookup of tables 404 (e.g., of a forwarding table or of a classification table), may obtain a packet descriptor that includes a forwarding address (e.g., a destination switch fabric port, a destination network port, etc.) and information for processing the packet, may sample the packet, and may manage the sampled packet and/or packet statistics.

In processing the packet, packet processing engine 406 may perform series of actions that may be specified by microinstructions. The microinstructions may be produced by compiling source code for an application or part of an operating system, such as, for example, Juniper Operating System (JUNOS), Cisco Internet Operating System (IOS), etc. In addition, packet processing engine 406 may execute the microinstructions in one or more threads or processes.

Figure 5:
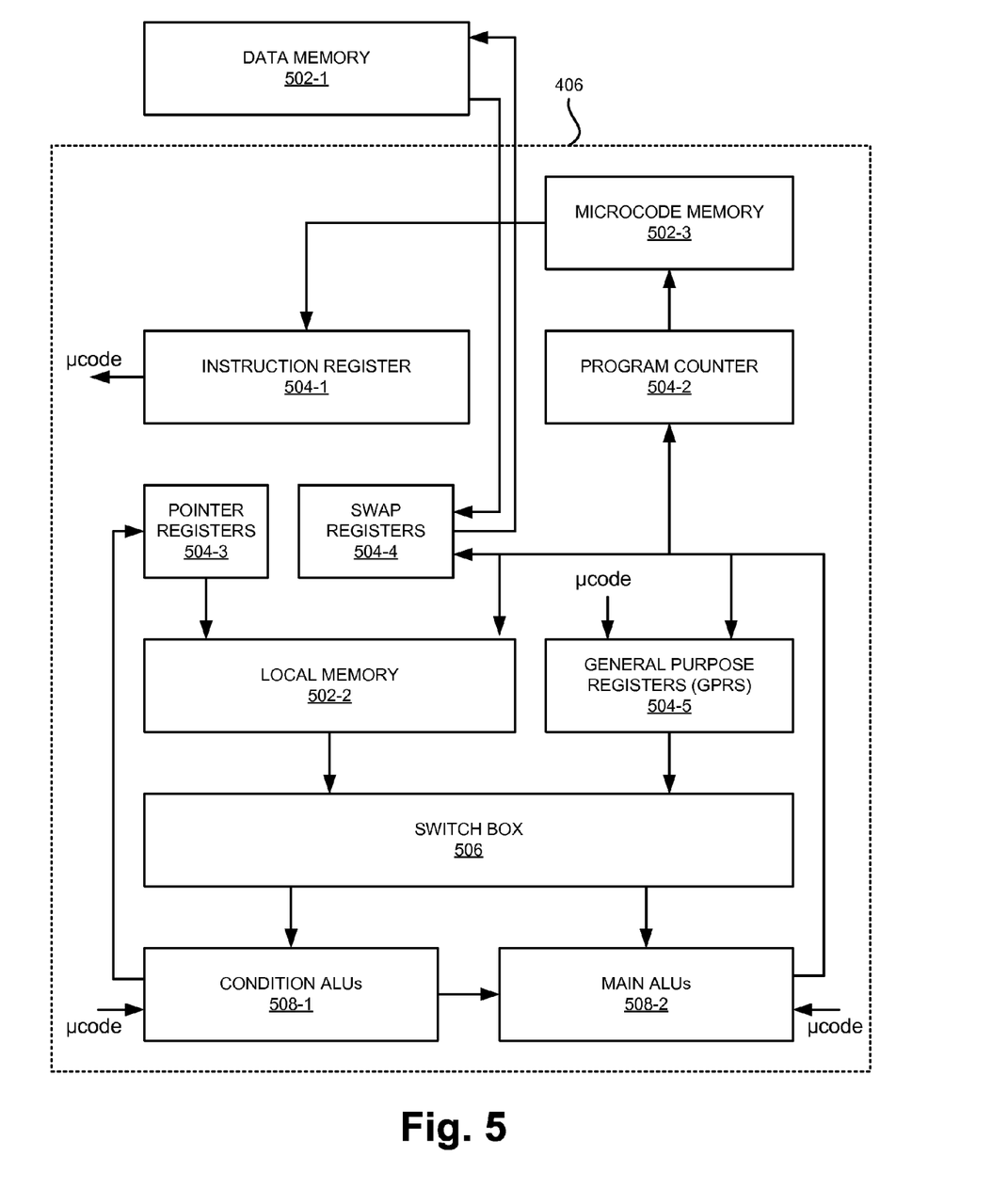
FIG. 5 is a functional block diagram of an exemplary packet processing engine of FIG. 4 and a data memory.

FIG. 5 is a block diagram of exemplary functional components of packet processing engine 406 and a data memory 502-1. As shown, packet processing engine 406 may include a local memory 502-2, a microcode memory 502-3, an instruction register 504-1, a program counter 504-2, pointer registers 504-3, swap registers 504-4, general purpose registers (GPRs) 504-5, a switch box 506, condition arithmetic logic units (ALUs) 508-1, and main ALUs 508-2. Although FIG. 5 shows exemplary functional components of packet processing engine 406, in other implementations, packet processing engine 406 may include fewer, different, or additional functional components than depicted in FIG. 5. For example, in one implementation, a cache and a dynamic memory may replace memories 502-1 through 502-3. Furthermore, packet processing engine 406 may include different data paths than the data paths depicted in FIG. 5.

Data memory 502-1 may include a memory device that may store a forwarding database (e.g., a forwarding information base (FIB)), routing policies, multiple instruction sets, etc. In some implementations, data memory 502-1 may be large, and, consequently, may be implemented off-chip (e.g., on a same semiconductor chip as other components of a processor). In such implementations, accessing data memory 502-1 can be slower than accessing other memories, such as local memory 502-2 or microcode memory 502-3, and therefore, efficient emulation of multiple instructions sets in data memory 502 may compensate for the slower memory access.

Local memory 502-2 may include a memory device that may store packet-related information (e.g., packet headers), configuration data, and/or constants. Microcode memory 502-3 may include a memory device that may store microinstructions. In some implementations, microcode memory 502-3 may be configured to store very long instruction word (VLIW) instructions.

Instruction register 504-1 may include a memory device that may store a currently executing instruction, which may have been retrieved from microcode memory 502-3. Program counter 504-2 may include a memory device that may store an address of currently executing microcode, and may be used to push/receive the address onto/from a call stack. In another implementation, program counter 504-2 may be used to calculate an address of next microcode to be loaded into instruction register 504-1. Pointer registers 504-3 may include a memory device that may store information that may be used to access local memory 502-2. For example, contents of pointer registers 504-3 may designate a specific address in local memory 502-2. Pointer registers 504-3 may accept output from condition ALUs 508-1.

Swap registers 504-4 may include a memory device that may include information for accessing a target instruction within an instruction set in data memory 502-1. By use of swap registers 504-4, a set of instructions may be "swapped in" for execution. In another implementation, different types of storage (e.g., dynamic memory, onboard cache, etc.) may be used in place of swap registers 504-4. Further details of swap registers 504-4 are provided below.

General purpose registers (GRPs) 504-5 may include a memory device that may store data and/or addresses. Specific fields within a microinstruction may select specific GPRs 504-5 that feed buses into switch box 506. Switch box 506 may include a multiplexer or similar mechanism for selecting data from specific buses (e.g., buses from GPRS 504-5, data memory 502-1, local memory 502-2. etc.). The selected data may be directed to other components, such as, for example, condition ALUs 508-1 or main ALUs 508-2.

Condition ALUs 508-1 may include arithmetic logic units (e.g., components that may perform arithmetic and logic operations within a processor). Condition ALUs 508-1 may compute conditions that drive branch decisions in a microinstruction or are input to another component of packet processing engine 406 (e.g., main ALUs 508-2). The computation may include arithmetic and/or logic operations (e.g., adding two numbers) performed on fields and sub-fields of a microinstruction, contents of GPRs 504-5, a portion of local memory 502-2, data memory 502-1, and constants (e.g., numbers, strings, etc.) from a memory (not shown). In addition, condition ALUs 508-1 may drive the selection of the next microinstruction in microcode memory 502-3.

Main ALUs 508-2 may include arithmetic logic units that perform arithmetic/logic operations on field and subfields of a microinstruction, GPRs 504-5, a portion of local memory 502-2, data memory 502-1, and constants from memory (not shown). The output of main ALUs 508-2 may be written to GPRs 504-5, data memory 502-1, local memory 502-2, and/or swap registers 504-4. Main ALUs 508-2 may perform specific arithmetic/logic operations on output/signals from the selected components/buses and/or condition ALUs 508-1. Further, main ALUs 508-2 may write a result of the computations into registers, local memory 504-1, and/or data memory 502-1.

In one example, a microinstruction may be read into instruction register 504-1. Various fields of the microinstruction in instruction register 504-1 may select specific GPRs 504-5, a portion of local memory 502-2, and/or a portion of data memory 502-1. In addition, the microinstruction may drive computations at condition ALUs 508-1 and main ALUs 508-2.

Figure 6:
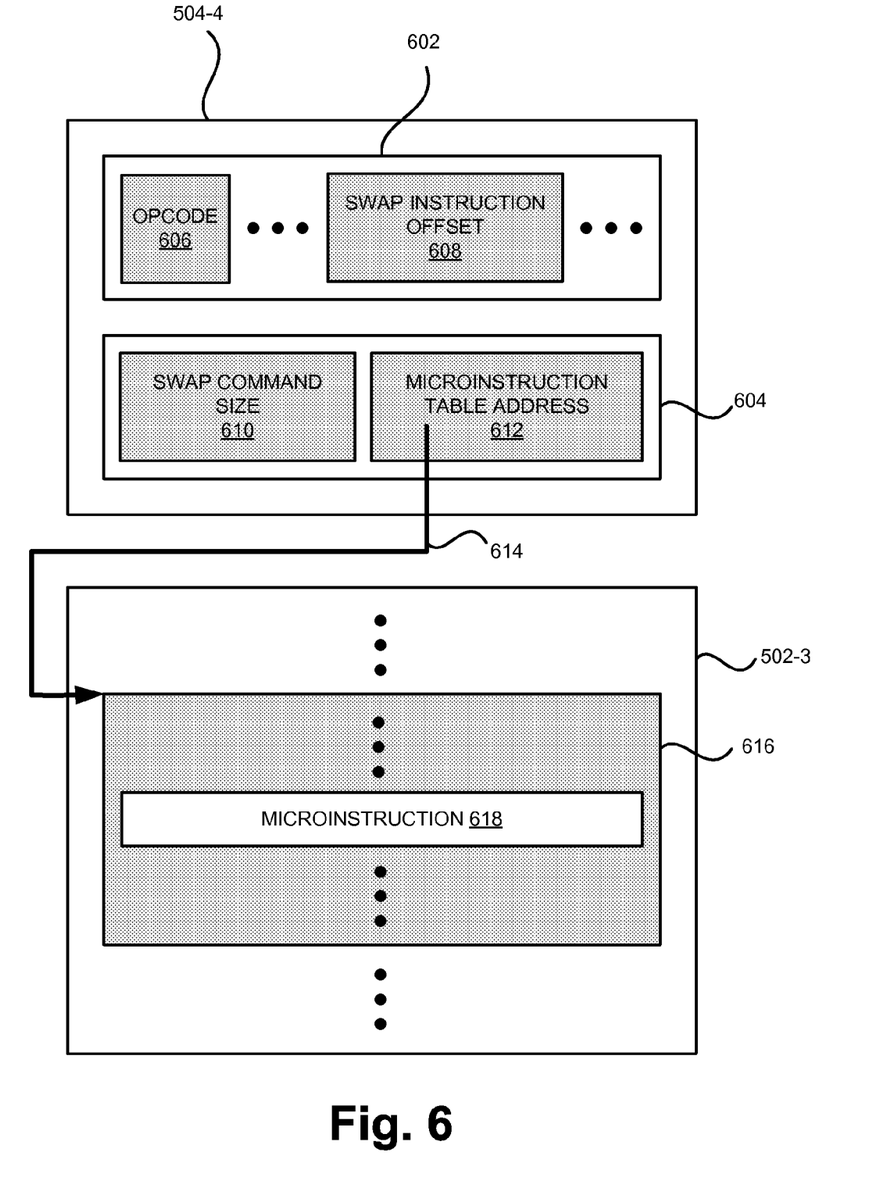
FIG. 6 is a functional block diagram of exemplary swap registers of FIG. 5.

FIG. 6 is a block diagram of exemplary functional components of microcode memory 502-3 and swap registers 504-4. As shown, swap registers 504-4 may include a swap instruction register 602 and a control register 604. Although FIG. 6 shows exemplary functional components of microcode memory 502-3 and swap registers 504-4, in other implementations, microcode memory 502-3 and swap registers 504-4 may include fewer, different, or additional functional components than depicted in FIG. 6.

Swap instruction register 602 may include a memory device that may receive and store a target instruction (not shown), which may include an operation code (opcode) field 606 and a swap instruction offset field 608. Opcode field 606 may include bit values that specify a specific instruction. Swap instruction offset field 608 may store a difference between a base address of a microinstruction table (e.g., microinstruction table 616) and an address of an instruction (e.g., microinstruction 618) within the microinstruction table. As described below, contents of swap instruction offset field 608 may be set based on output of other components of packet processing engine 406.

Control register 604 may include a swap command size field 610 and a microinstruction table address field 612. Swap command size field 610 may include a length, in bits, of opcode that may be stored in opcode field 606. Microinstruction table address 612 may include a base address of a microinstruction table (e.g., microinstruction table 616). This is indicated by arrow 614 from microinstruction table address field 612 to the top of microinstruction table 616.

As further shown in FIG. 6, microcode memory 502-3 may include microinstruction tables, such as microinstruction table 616. Microinstruction table 616 may include microinstructions, such as microinstruction 618. In one implementation, each microinstruction in microinstruction table 616 may include the first of one or several microinstructions that may emulate a target instruction in swap instruction register 602.

Exemplary Process for Emulating Multiple Instruction Sets

Figure 7:
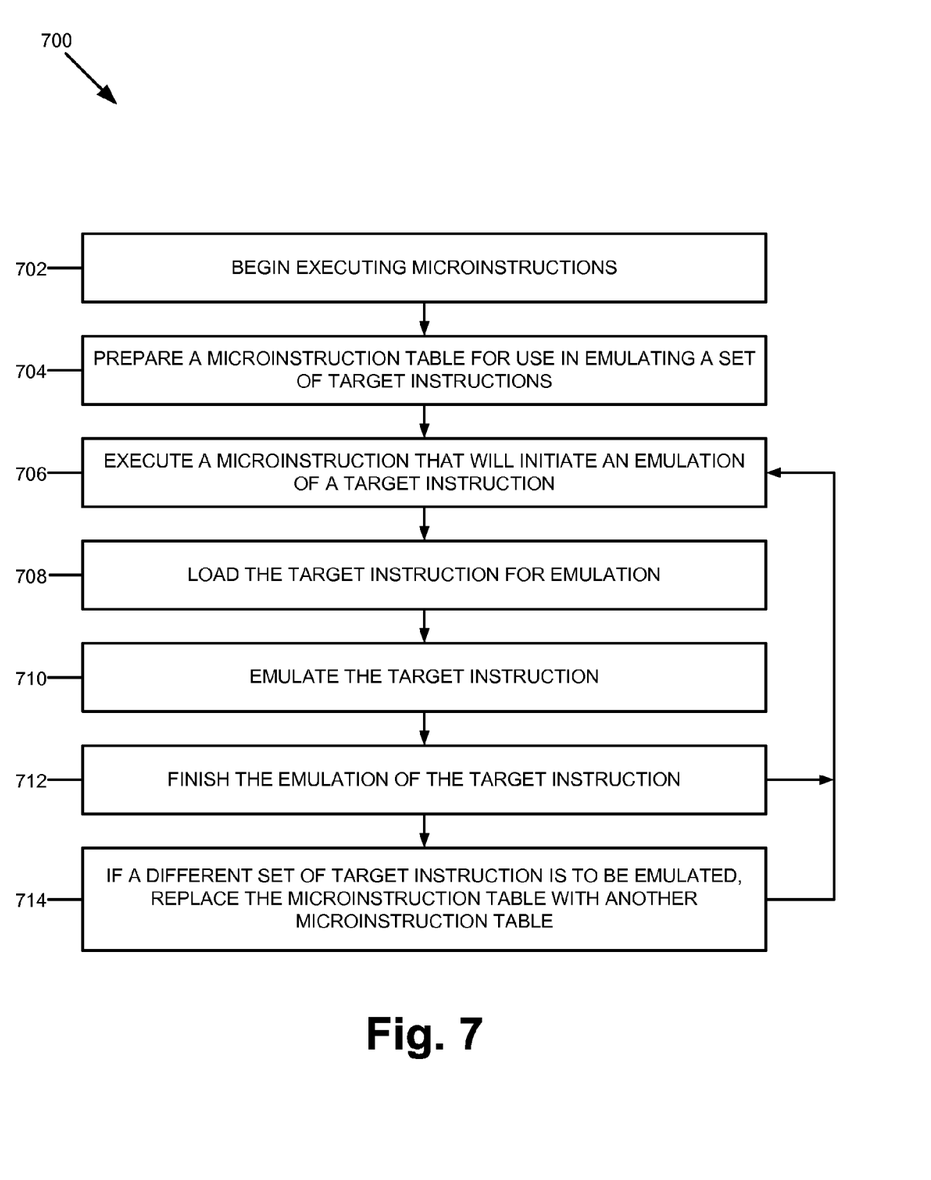
FIG. 7 is a flow diagram of an exemplary process for emulating multiple instruction sets.

The above paragraphs describe system elements that may be related to devices and/or components for emulating multiple instruction sets. FIG. 7 illustrates a flow diagram of an exemplary process 700 that is capable of being performed by one or more of these devices and/or components.

It may be assumed that a software program (e.g., an application, an operating system, etc.) has been compiled into microinstructions and multiple target instruction sets. As described above, the microinstructions may include multiple microinstruction tables for emulating each of the target instruction sets. Also, it may be assumed that the microinstructions and the target instruction sets have been installed or loaded, for execution, onto microcode memory 502-3 and data memory 502-1 of packet processing engine 406. While device 202-x may be capable of executing microcode 616 in one or more threads or processes, process 700 may be described in terms of a single thread.

Process 700 may begin with device 202-x executing microinstructions (block 702). For example, device 202-x may execute the microinstructions as a result of a function call, or via an operating system that loads the microinstructions.

Device 202-x may prepare microinstruction table 616 for use in emulating a set of target instructions (block 704). For example, device 202-x may prepare microinstruction table 616 by obtaining the base address of microinstruction table 616 and storing the base address in microinstruction table address field 612 of control register 604. As described above, microinstruction table 616 may include a first of microinstructions that emulate a target instruction.

As further shown in FIG. 7, device 202-*x* may execute a microinstruction that will initiate an emulation of a target instruction (block 706). In one implementation, execution of the microinstruction may result in a function call, a jump to other microinstructions, or generate an interrupt that results in an emulation of the target instruction. In some implementations, execution of the microinstruction may generate a software/hardware trap that leads to the emulation.

For example, in one implementation, execution of the microinstruction may access contents of an external memory where the target instruction is stored. Accessing the target instruction may trigger a trap (e.g., software or hardware condition that alters a flow of program execution) that may lead to the emulation. In such an implementation, triggering the trap may allow the emulation to occur without, for example, a computed branch, and therefore, may save one or more microinstruction processing cycles.

Returning to FIG. 7, device 202-*x* may load the target instruction for emulation (block 708). In some implementations, device 202-*x* may load the target instruction into a memory. In one implementation, device 202-*x* may load the target instruction into swap instruction register 602.

Loading the target instruction into swap instruction register 602 may include setting several fields in swap instruction register 602. For example, device 202-*x* may copy contents of an opcode field in the target instruction to opcode field 606. In another example, device 202-*x* may store a memory offset of a microinstruction (e.g., a difference between an address of microinstruction 618 and the starting address of microinstruction table 616).

In one implementation, the memory offset may be obtained in accordance with the following expression:

$$\text{OFFSET} = \text{BitReverse(CMD)} \ \& \ \text{MASK} \tag{1}$$

In expression (1), OFFSET may represent a memory offset to be determined and stored in swap instruction offset field 608. CMD may represent a portion of the contents of opcode field 606. BitReverse(CMD) may represent a value obtained by reversing the order of bits in CMD. BitReverse(CMD) & MASK may include a logical AND of BitReverse(CMD) and MASK.

MASK may be generated by clearing a number of bits equal to the length of opcode field 606 to "0," and then setting some of the cleared bits to "1," starting from a least significant bit (e.g., the right-most bit). The number of bits that are set to "1" may be equal to the value stored in swap command size field 610 of control register 604.

For example, it may be assumed that an opcode in opcode field 606 is "0b01101101" in binary format, and a value of "5" is stored in swap command size field 606. Therefore, CMD may equal 0b01101101, and BitReverse(CMD) may equal 0b10110110. MASK may be generated by starting with "0b00000000" and setting 5 right-most bits to "1." Consequently, MASK may equal 0b00011111. BitReverse(CMD) & MASK may be equivalent to "0b10110110 & 0b00011111," which may yield "0b00010110."

In expression (1), because the opcode in opcode field 606 is left-adjusted, masking off unused bits may result in a binary number with a string of zeros. If such a number were used as an offset, microinstruction table 616 may include "holes" that are devoid of microinstructions, and may result in inefficient use of microcode memory 502-3. To avoid the preceding, CMD is bit reversed before applying the mask.

To illustrate, without the bit reversal, MASK=0b11111000, and OFFSET=CMD & MASK=0b01101101 & 0b11111000=0b01101000, which includes three trailing zeros. Any offset computed in such a manner may include three trailing zeros, and thus, any two microinstructions in microinstruction memory 502-3 may be separated by at least 0b00001000 x (instruction size) bytes.

Returning to FIG. 7, device 202-*x* may emulate the target instruction (block 710). To emulate the target instruction, device 202-1 may locate the first of microinstructions that are to emulate the target instruction and may execute the microinstructions. To locate the first microinstruction, device 202-*x* may evaluate the following expression:

$$\text{ADDR} = \text{OFFSET} | \text{TABLE\_ADDRESS} \tag{2}$$

In expression (2), ADDR may represent an address to be determined, OFFSET may represent a memory offset determined at block 708 based on expression (1), and TABLE_ADDRESS may represent contents of microinstruction table address field 612. OFFSET|TABLE_ADDRESS may represent a logical OR of OFFSET and TABLE_ADDRESS.

In the above, an opcode in opcode field 606 may be viewed as an index into microinstruction table 616, and, therefore, operations such as reversing the bits of the opcode, masking the bits, and/or ORing OFFSET and TABLE_ADDRESS may be required to produce a valid microinstruction address. The validity of the microinstructions' addresses that are determined in accordance with expressions (1) and (2) may depend on the compiler that originally produced the microinstructions and the multiple target instruction sets.

Once the address of the first microinstruction is determined in accordance with expression (2), device 202-*x* may execute the first microinstruction. Furthermore, executing the first microinstruction may cause other microinstructions to be loaded from microcode memory 504-2 and executed, resulting in an emulation of the target instruction.

As further shown in FIG. 7, device 202-*x* may finish emulation of the target instruction (block 712). Depending on the implementation, executing the last microinstruction in the emulation may cause an executing thread to jump from the last microinstruction to another microinstruction, generate an interrupt, or produce a return trap that terminates the emulation. In some instances, finishing the last microinstruction may cause execution of a sequence of target instructions from the same target instruction set. Such a technique may be used, for example, to execute a sequence of tree lookup target instructions.

If a different set of microinstructions is to be emulated, device 202-*x* may replace the microinstruction table with another microinstruction table (block 714), and may return to block 706 to emulate the target instructions. To replace the microinstruction table, device 202-*x* may replace the base address of the microinstruction table in microinstruction table address field 612 with the base address of the other microinstruction table.

In process 700, device 202-*x* may switch from emulating one target instruction set to emulating another target instruction set (e.g., emulate multiple instruction sets) by setting microinstruction table address field 612 in control register 604 to the base address of a microinstruction table that corresponds to the other target instruction set. The switch may be computationally efficient since it may incur zero or few additional processing cycles.

CONCLUSION

The foregoing description of implementations provides illustration, but is not intended to be exhaustive or to limit the implementations to the precise form disclosed. Modifications and variations are possible in light of the above teachings or may be acquired from practice of the teachings.

For example, while a series of blocks has been described with regard to exemplary processes illustrated in FIG. 7, the order of the blocks may be modified in other implementations. In addition, non-dependent blocks may represent acts that can be performed in parallel to other blocks.

It will be apparent that aspects described herein may be implemented in many different forms of software, firmware, and hardware in the implementations illustrated in the figures. The actual software code or specialized control hardware used to implement aspects does not limit the invention. Thus, the operation and behavior of the aspects were described without reference to the specific software code—it being understood that software and control hardware can be designed to implement the aspects based on the description herein.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the present application should be construed as critical or essential to the implementations described herein unless explicitly described as such. Also, as used herein, the article "a" is intended to include one or more items. Where one item is intended, the term "one" or similar language is used. Further, the phrase "based on" is intended to mean "based, at least in part, on" unless explicitly stated otherwise.

What is claimed is:

1. A method comprising:
   emulating, by a device, target instructions by executing a first set of microinstructions,
   the first set of microinstructions including microcode that imitates execution of the target instructions;
   storing, by the device, a base address of a table that includes a microinstruction provided in a second set of microinstructions for emulating the target instructions,
   the second set of microinstructions including microcode that imitates execution of the target instructions;
   obtaining, by the device, a memory offset of the microinstruction provided in the second set of microinstructions,
   the memory offset being determined by:
      obtaining an operation code of the target instructions;
      performing a mathematical operation on an order of bits in the operation code; and
      masking, based on performing the mathematical operation, a quantity of bits in the operation code to determine the memory offset;
   locating, by the device, the microinstruction based on the stored base address and based on the memory offset; and
   emulating, by the device, one of the target instructions by executing the located microinstruction.

2. The method of claim 1, further comprising:
   storing a base address of another table that includes at least one microinstruction from the first set of microinstructions.

3. The method of claim 1, further comprising:
   determining the memory offset from the base address, and when locating the microinstruction, the method further includes:
      producing a logical-OR of the memory offset and the base address to obtain an address of the microinstruction.

4. The method of claim 1, where the mathematical operation includes:
   reversing the order of bits in the operation code.

5. The method of claim 1, further comprising:
   loading contents of the one of the target instructions into a register for emulation.

6. The method of claim 5, where loading contents of the one of the target instructions includes:
   copying an operation code of the one of the target instructions into the register.

7. The method of claim 1, further comprising:
   requesting an external memory access.

8. The method of claim 7, further comprising at least one of:
   triggering a trap to start emulating the one of the target instructions,
   jumping to the microinstruction,
   triggering an interrupt, or
   calling the microinstruction.

9. The method of claim 1, further comprising:
   returning from emulation of the one of the target instructions by triggering a return trap.

10. The method of claim 1, where emulating the one of the target instructions includes one of:
    emulating a tree instruction;
    emulating a nexthop instruction;
    emulating a sub-nexthop instruction; or
    emulating a firewall instruction.

11. A device comprising:
    a first memory for storing target instructions; and
    a processor including:
       a second memory for storing a first set of microinstructions and a second set of microinstructions, and
       registers for loading the target instructions from the first memory, and
       the processor is to:
          emulate the target instructions by executing the first set of microinstructions,
             the first set of microinstructions including microcode that imitates execution of the target instructions;
          store, in at least one register of the registers, a base address of a table that includes a microinstruction provided in the second set of microinstructions,
             the second set of microinstructions including microcode that imitates execution of the target instructions;
          obtain the base address of the table from the at least one register;
          obtain a memory offset of the microinstruction provided in the second set of microinstructions,
             the memory offset being determined by obtaining an operation code of the target instructions, performing a mathematical operation on an order of bits in the operation code, and masking, based on performing the mathematical operation, a quantity of bits in the operation code to determine the memory offset;
          use the base address to locate the microinstruction based on the memory offset; and
          emulate one of the target instructions by executing the microinstruction.

12. The device of claim 11, where the device comprises one of:

a personal computer;
a router;
a switch;
a gateway; or
a server.

13. The device of claim 11, where the table includes:
a trap vector for handling traps.

14. The device of claim 11, where the registers include:
a control register for storing parameters that are associated with decoding one of the target instructions; and
a holding register for storing values in fields of the one of the target instructions.

15. The device of claim 14, where the control register includes at least one of:
a command size field that stores a length of an operation code; or
the base address of the table.

16. The device of claim 14, where the holding register includes at least one of:
an operation code of one of the target instructions; or
the memory offset.

17. The device of claim 16, where the mathematical operation includes:
reversing the order of bits in the operation code.

18. The device of claim 11, where the first memory includes an off-chip memory, and the second memory includes a microinstruction memory.

19. The device of claim 11, where the microinstruction includes a very long instruction word (VLIW).

20. A non-transitory computer-readable medium containing instructions comprising:
one or more instructions which, when executed by at least one device, cause the at least one device to store a target instruction;
one or more instructions which, when executed by the at least one device, cause the at least one device to store a plurality of sets of microinstructions;
one or more instructions which, when executed by the at least one device, cause the at least one device to emulate the target instruction by executing one of the plurality of sets of microinstructions,
the one of the plurality of sets of microinstructions including microcode that imitates execution of the target instruction;
one or more instructions which, when executed by the at least one device, cause the at least one device to store a base address of a table that includes a microinstruction of another of the plurality of sets of microinstructions,
the other of the plurality of sets of microinstructions including microcode that imitates execution of the target instruction;
one or more instructions which, when executed by the at least one device, cause the at least one device to obtain a memory offset of the microinstruction of the other of the plurality of sets of microinstructions,
the memory offset being determined by obtaining an operation code of the target instructions, performing a mathematical operation on an order of bits in the operation code, and masking, based on performing the mathematical operation, a quantity of bits in the operation code to determine the memory offset;
one or more instructions which, when executed by the at least one device, cause the at least one device to use the stored base address to access, based on the memory offset, the microinstruction in the other of the plurality of sets of microinstructions; and
one or more instructions which, when executed by the at least one device, cause the at least one device to emulate the target instruction by accessing the microinstruction in the other of the plurality of sets of microinstructions and executing the accessed microinstruction.

\* \* \* \* \*